United States Patent
Mack et al.

(10) Patent No.: US 7,060,988 B2
(45) Date of Patent: Jun. 13, 2006

(54) METHOD AND APPARATUS FOR IMPROVED BEAM STABILITY IN HIGH CURRENT GAS-CLUSTER ION BEAM PROCESSING SYSTEM

(75) Inventors: Michael E. Mack, Manchester, MA (US); Robert K. Becker, Danvers, MA (US); Matthew C. Gwinn, Winchendon, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 11/082,584

(22) Filed: Mar. 17, 2005

(65) Prior Publication Data

US 2005/0205801 A1     Sep. 22, 2005

Related U.S. Application Data

(60) Provisional application No. 60/553,767, filed on Mar. 17, 2004.

(51) Int. Cl.
*H01J 27/00*     (2006.01)

(52) U.S. Cl. .................................. 250/423 R; 250/424
(58) Field of Classification Search ............ 250/423 R, 250/424, 251
See application file for complete search history.

(56) References Cited

U.S. PATENT DOCUMENTS

| | | | |
|---|---|---|---|
| 5,814,194 A | 9/1998 | Deguchi et al. | 204/192.1 |
| 6,331,227 B1* | 12/2001 | Dykstra et al. | 156/345.29 |
| 6,416,820 B1 | 7/2002 | Yamada et al. | 427/530 |
| 6,629,508 B1 | 10/2003 | Dykstra | 118/723 |
| 6,646,277 B1 | 11/2003 | Mack et al. | |
| 2004/0113093 A1 | 6/2004 | Mack | 250/369 R |

* cited by examiner

*Primary Examiner*—Kiet T. Nguyen
(74) *Attorney, Agent, or Firm*—Jerry Cohen; John A. Hamilton

(57) ABSTRACT

Apparatus and methods for improving beam stability in high current gas-cluster ion beam systems by reducing the frequency of transients occurring in the vicinity of the ionizer through use of shielding conductors and distinct component electrical biasing to inhibit backward extraction of ions from the ionizer towards the gas-jet generator.

23 Claims, 5 Drawing Sheets

METHOD AND APPARATUS FOR IMPROVED BEAM STABILITY IN HIGH CURRENT GAS-CLUSTER ION BEAM PROCESSING SYSTEM

CROSS-REFERENCE TO RELATED APPLICATIONS

This application claims the benefit of priority to U.S. Provisional Application Ser. No. 60/553,767 filed 17 Mar. 2004 and entitled "Method and Apparatus for Improved Beam Stability in High Current Gas-Cluster Ion Beam Processing System," the contents of which are incorporated herein by reference.

FIELD OF THE INVENTION

This invention relates generally to the generation of an increased-current (high current) gas-cluster ion beam (GCIB) for processing the surfaces of workpieces, and, more particularly to improving the beam stability of a high current GCIB and reducing interruptions and transients in a high current GCIB for more reliable and higher quality industrial processing with GCIB.

BACKGROUND OF THE INVENTION

The use of a gas-cluster ion beam (GCIB) for etching, cleaning, and smoothing surfaces is known (see for example, U.S. Pat. No. 5,814,194, Deguchi, et al.) in the art. GCIBs have also been employed for assisting the deposition of films from vaporized carbonaceous materials (see for example, U.S. Pat. No. 6,416,820, Yamada, et al.) As the term is used herein, gas-clusters are nano-sized aggregates of materials that are gaseous under conditions of standard temperature and pressure. Such clusters may be comprised of aggregates of from a few to several thousand molecules or more, loosely bound to form the clusters. The clusters can be ionized by electron bombardment or other means, permitting them to be formed into directed beams of controllable energy. Such ions each typically carry positive charges of q·e (where e is the magnitude of the electronic charge and q is an integer of from one to several representing the charge state of the cluster ion). The larger sized clusters are often the most useful because of their ability to carry substantial energy per cluster ion, while yet having only modest energy per molecule. The clusters disintegrate on impact, with each individual molecule carrying only a small fraction of the total cluster energy. Consequently, the impact effects of large clusters are substantial, but are limited to a very shallow surface region. This makes ion clusters effective for a variety of surface modification processes, without the tendency to produce deeper subsurface damage characteristic of conventional ion beam processing.

Means for creation of and acceleration of such GCIBs are described in the reference (U.S. Pat. No. 5,814,194) previously cited, the teachings of which are incorporated herein by reference. Presently available ion cluster sources produce clusters ions having a wide distribution of sizes, N, up to N of several thousand (where N=the number of molecules in each cluster—in the case of monatomic gases like argon, an atom of the monatomic gas will be referred to as either an atom or a molecule and an ionized atom of such a monatomic gas will be referred to as either an ionized atom, or a molecular ion, or simply a monomer ion—throughout this discussion).

Many useful surface-processing effects can be achieved by bombarding surfaces with GCIBs. These processing effects include, but are not necessarily limited to, smoothing, etching, film growth, and infusion of materials into surfaces. In many cases, it is found that in order to achieve industrially practical throughputs in such processes, GCIB currents on the order of hundreds or perhaps thousands of microamps are required. Experimental GCIB beam currents have been reported on the order of several hundreds or a few thousands of microamperes in the form of short duration transient beam bursts. But, for industrial productivity and high quality surface processing results, GCIB processing equipment for etching, smoothing, cleaning, infusing, or film formation must produce steady, long-term-stable beams so that GCIB processing of a workpiece surface can proceed for minutes or hours without interruption or beam current transients. GCIB processing equipment possessing such long-term stability has been heretofore limited to beam currents on the order of a few hundreds of microamperes. Attempts to form higher beam currents have heretofore generally resulted in beams without long-term stability and having frequent beam transients (commonly called "glitches") resulting from arcing or other transient effects in the beamlines. Such transients can arise in a variety of ways, but their effect is to produce non-uniform processing of the workpieces or, in the case of severe arcing, even physical damage to or transient misbehavior of control systems in the GCIB processing systems.

Thus, there exists a need to provide methods and apparatus for improving the beam stability in high current GCIB workpiece processing systems. It is an object of the invention to fulfill such need.

SUMMARY OF THE INVENTION

The object set forth above as well as further and other objects and advantages of the present invention are achieved by the embodiments of the invention described hereinbelow.

In efforts to achieve stable high current GCIBs for workpiece processing in a GCIB processing system, developments in GCIB ionization sources, management of beam space charge, and management of workpiece charging have all been important areas of development. U.S. Pat. No. 6,629,508 to Dykstra; U.S. Pat. No. 6,646,277 to Mack et al.; and co-pending U.S. patent application Ser. No. 10/667,006, the contents of all of which are incorporated herein by reference as though set out at length herein, each describe advances in several of these areas that have resulted in the ability to produce GCIB beams of at least several hundreds of microamperes to one or more milliamperes of beam current. These beams, however, can exhibit, in some cases, instabilities that may limit their optimal use in industrial applications. In general, the generation of higher GCIB beam currents results in the introduction of greater amounts of gas into the beamline. Inherently, a gas-cluster ion beam transports gas. For an argon beam having a beam current, $I_B$, the gas flow, F(sccm—standard cubic centimeters per minute), transmitted in the beam is $$F = 2.23 \times 10^{-18} \left(\frac{N}{q}\right)\left(\frac{I_B}{e}\right) \qquad \text{(Eqn. 1)}$$

Accordingly, for a beam current of only 400 μA and an N/q ratio of 5000, the beam conducts a substantial gas flow of about 27 sccm. In a typical GCIB processing tool, the ionizer and the workpiece being processed are each typically contained in separate chambers. This provides for better control of system pressures. However, even with excellent vacuum system design and differential isolation of various regions of the apparatus, a major area of difficulty with beams carrying large amounts of gas is that pressures may increase throughout the beamline. The entire gas load of the beam is released when the gas-cluster ion beam strikes the target region, and some of this gas influences pressures throughout the GCIB processing system's vacuum chambers. Because high voltages are often used in the formation and acceleration of GCIBs, increased beamline pressures can result in arcing, discharges, and other beam instabilities. As beam currents are increased, gas transport by the beam increases and pressures throughout the beamline become more difficult to manage. Because of the unique ability, compared to a conventional ion beam, of a GCIB to transport and release large amounts of gas throughout the beamline, pressure related beam instabilities and electrical discharges are much more of a problem for high current GCIBs than for conventional ion beams. In a typical GCIB ion source, neutral gas-clusters in a beam are ionized by electron bombardment. The ionizer region is generally a relatively poor vacuum region and is also typically at a high electrical potential relative to surrounding structures.

The present invention uses a combination of an electrical biasing technique and a shielding technique to reduce the frequency of transients occurring in the vicinity of the ionizer of a of a GCIB workpiece processing system's ion source.

BRIEF DESCRIPTION OF THE FIGURES

For a better understanding of the present invention, together with other and further objects thereof, reference is made to the accompanying drawing and detailed description, wherein.

DETAILED DESCRIPTION OF PREFERRED EMBODIMENTS OF THE INVENTION

Figure 1:
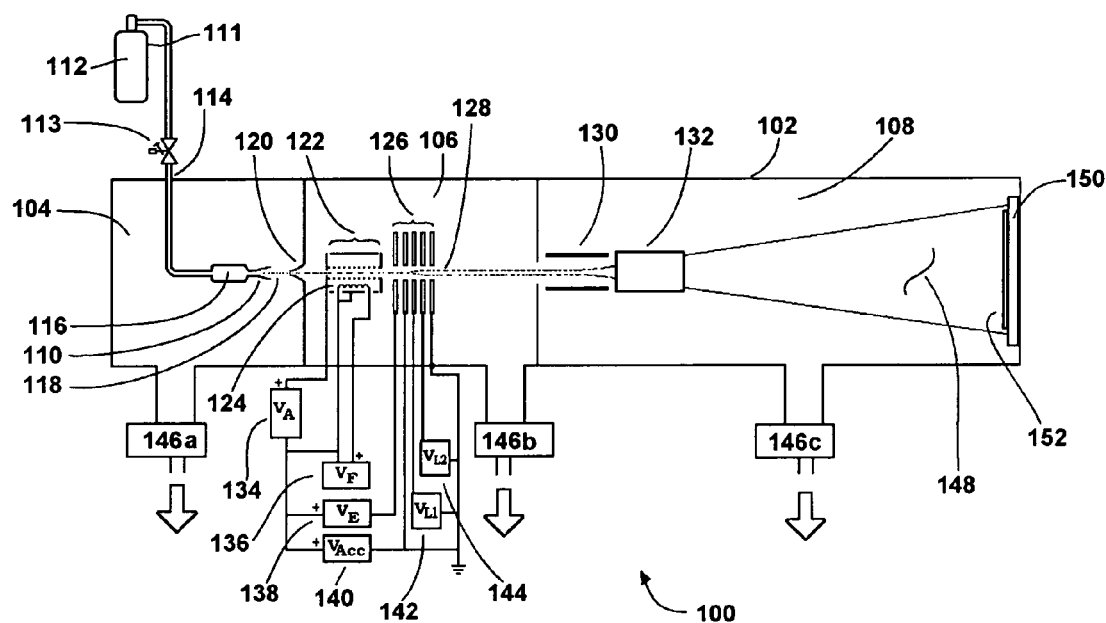
FIG. 1 is a schematic showing the basic elements of a prior art GCIB processing apparatus that uses an electrostatically scanned beam.

FIG. 1 shows a schematic of the basic elements of a typical configuration for a GCIB processing apparatus 100 of a form known per se in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas-jet 118 is thereby generated. Cooling, which results from the expansion in the jet, causes a portion of the gas-jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases. The skimmer aperture 120 is preferably circular so as to form a substantially cylindrical cluster jet.

After the supersonic gas-jet 118 containing gas-clusters has been formed by the gas-jet generator (i.e., the components in source chamber 104, including skimmer aperture 120), the clusters are ionized in an ionizer 122, which preferably has a substantially cylindrical geometry coaxially aligned with the cluster gas-jet 118. The ionizer 122 is typically an electron impact ionizer that produces thermoelectrons from one or more incandescent filaments 124 and accelerates and directs the electrons causing them to collide with the gas-clusters in the gas-jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas-jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{ACC}$ to bias a high voltage electrode with respect to the ionizer 122 so as to result in a total GCIB acceleration equal to $V_{ACC}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
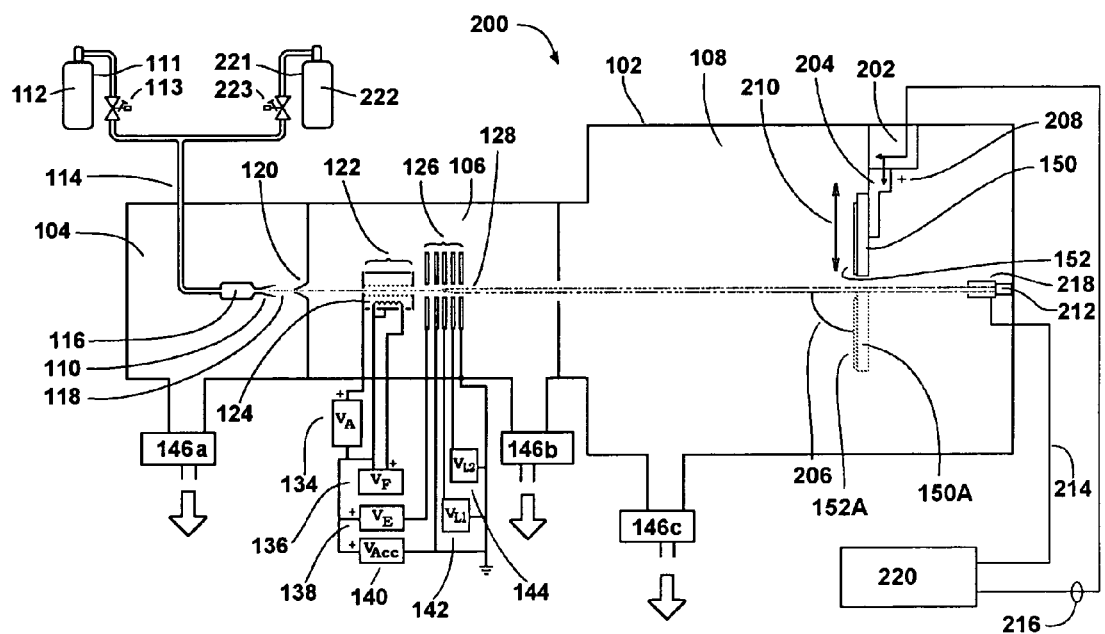
FIG. 2 is a schematic showing the basic elements of a prior art GCIB processing apparatus that uses a stationary beam with mechanical scanning of the workpiece and that includes provision for mixing source gases.

FIG. 2 shows a schematic of the basic elements of a prior art mechanically scanning GCIB processing apparatus 200 having a stationary beam with a mechanically scanned workpiece 152, and having a conventional faraday cup for beam measurement and a conventional thermionic neutralizer. GCIB formation is similar to as shown in FIG. 1, except there is additional provision for an optional second source gas 222 (typically different from the source gas 112) stored in a gas storage cylinder 221 with a gas metering valve 223 and connecting through gas feed tube 114 into stagnation chamber 116. Although not shown, it will be readily appreciated by those of skill in the art that three or more source gases can easily be arranged for by adding additional gas storage cylinders, plumbing, and valves. This multiple gas arrangement allows for controllably selecting between two differing source gasses 112 and 222 or for controllably forming a mixture of two (or more) source gasses for use in forming gas-clusters. It is further understood that the source gases, 112, and 222, may themselves be mixtures of gases. In addition, in the mechanically scanning GCIB processing apparatus 200 of FIG. 2, the GCIB 128 is stationary (not electrostatically scanned as in the GCIB processing apparatus 100) and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or near 90 degrees. During Y-scanning, the workpiece 152 held by workpiece holder 150 moves from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 2, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 3:
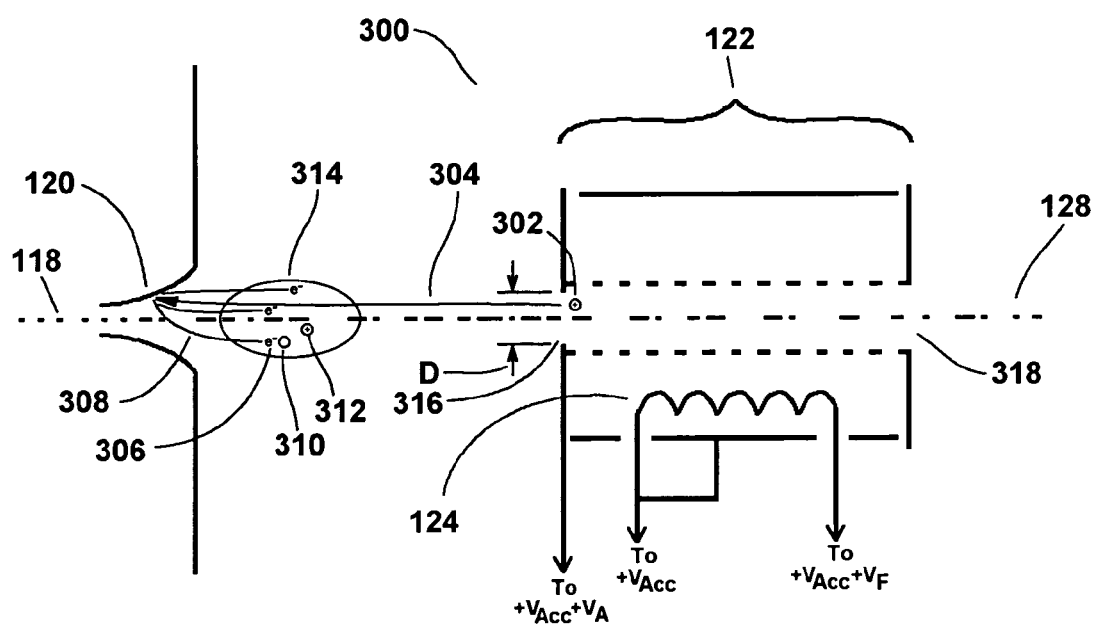
FIG. 3 is a more detailed schematic view of a portion of the prior art GCIB processing apparatus of FIG. 2.

FIG. 3 is a more detailed schematic view of a portion 300 of the prior art GCIB processing apparatus of FIG. 2. The portion 300 shown in greater detail comprises the gas skimmer aperture 120, the ionizer 122, and the supersonic gas-jet 118, which is converted into a GCIB 128 by ionizing action of the ionizer 122. According to desired GCIB source operation, the supersonic gas-jet 118 of neutral gas-clusters, enters the ionizer 122 through the ionizer entrance aperture 316, is at least partially ionized by electron impact ionization occurring within the ionizer 122, and exits the ionizer exit aperture 318 as a GCIB 128. The body of the ionizer is biased at an isolated electrical potential of $V_{Acc}$ with respect to the vacuum vessel and other system components, and so the ionized GCIB 128 is accelerated through a potential of $V_{Acc}$ before reaching the workpiece 152 (shown in FIG. 2.) Since at least a portion of the gas generator (i.e., the gas skimmer aperture 120) is electrically conductive and attached to the vacuum vessel (102 in FIG. 2), which is electrically isolated from the ionizer 122, there is a potential difference of approximately $V_{Acc}$ between the electrically conductive portion of the gas generator (i.e., ionizer entrance aperture 316) and the gas skimmer aperture 120. $V_{Acc}$ is typically in a range from about 1 kV to 60 s of kV. The ionizer entrance aperture 316 has a diameter, D, which is typically a few centimeters. Some positive ions 302 in the ionizer 122, near the ionizer entrance aperture 316, inevitably drift backward toward the ionizer entrance aperture 316 and are extracted backward through the ionizer entrance aperture by the high potential difference between ionizer 122 and the skimmer aperture 120. These ions might be ionized residual gas or decomposition products from cluster breakup caused by electron bombardment or otherwise. Upon exiting the ionizer 122, these ions are strongly repelled by the potential, $V_{Acc}$, on the ionizer 122 accelerating them to high energy. They follow trajectories 304 that cause them to travel to the gas skimmer aperture 120 and nearby regions, where they impact, ejecting secondary electrons 306. The secondary electrons 306 are accelerated toward the ionizer 122 by the positive potential $V_{Acc}$ on the ionizer and follow trajectories 308. The accelerated secondary electrons 306 in the supersonic gas-jet 118, which contains gas and gas-clusters 310, ionizes the gas and/or gas-clusters in the supersonic gas-jet 118 and form positive ions 312, creating a plasma region 314 near the gas skimmer aperture 118 and between the gas skimmer aperture 118 and the ionizer entrance aperture 316. This can initiate a discharge between the gas skimmer aperture 120 and the ionizer 122. This discharge disintegrates clusters and draws higher currents causing momentary overload and shut down of the accelerator power supply (140 in FIG. 2) resulting in a transient interruption or "glitch" in the GCIB 128. Producing increased GCIB current requires higher gas flow in the supersonic gas-jet 118, increased electron currents in the ionizer 122, and greater release of beam-transported gas when the GCIB is dissociated at the workpiece. All of the factors contribute to increased likelihood of the above-described mechanism producing beam "glitches," with the glitch rate generally increasing as GCIB beam currents are raised.

Figure 4:
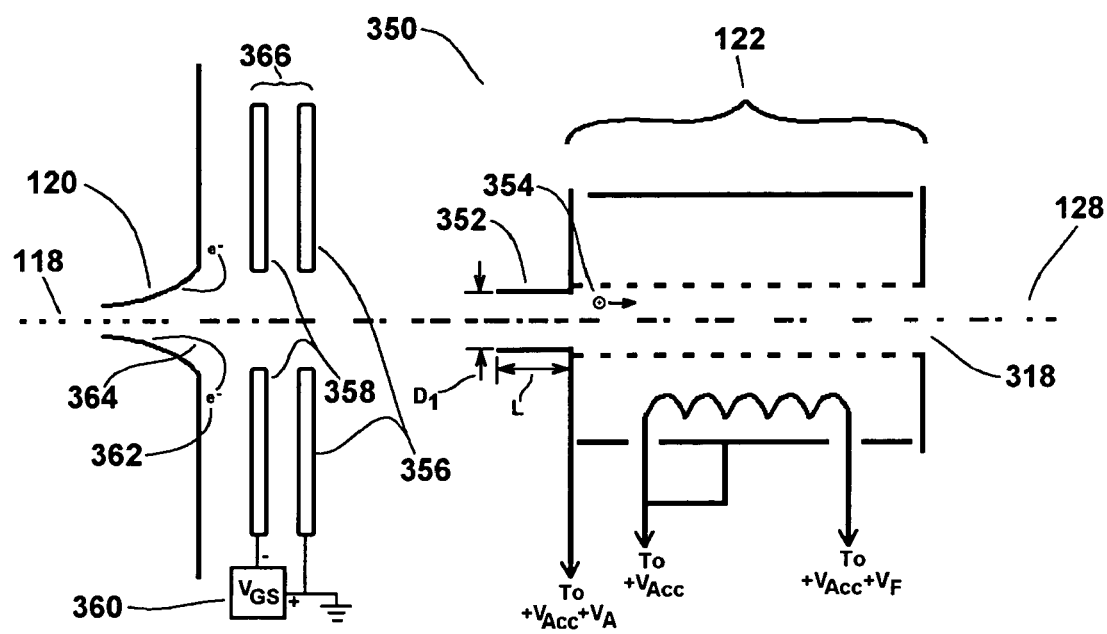
FIG. 4 is a schematic view of the same region of a GCIB processing apparatus as shown in FIG. 3, but including the improvements of the present invention.

FIG. 4 is a schematic view of a region 350 of a somewhat similar GCIB processing apparatus as shown in FIG. 3, but including mechanisms permitting increased GCIB currents while reducing or minimizing "glitches." A tubular conductor such as, for example, extension tube 352 is shown as an integral part of the ionizer 122 disposed at the entrance aperture of the ionizer 122, however the extension tube need not be so integrally connected. The extension tube 352 is electrically conductive and electrically attached to the ionizer 122 and is thus at the ionizer potential. Other configurations which achieve approximately the same potential relationship between the extension tube 352 and the ionizer 122 may be employed. Extension tube 352 has an inner diameter, $D_1$, that is approximately the same as D, the diameter of the ionizer entrance aperture (316 in FIG. 3) of the ionizer 122. Extension tube 352 has a length, L, which is preferably greater than $D_1$ and, more preferably, greater than $2 \cdot D_1$. The walls of extension tube 352 are electrically conductive, preferably metallic, and may be perforated or configured as a plurality of connected, coaxial rings or made of screen material to improve gas conductance. Extension tube 352 shields the interior of the ionizer 122 from external electric fields, reducing the likelihood that a positive ion (354 for example) formed near the entrance aperture of the ionizer 122 will be extracted backwards out of the ionizer and accelerated toward the gas skimmer aperture 120.

An electron suppressor apparatus 366 comprises an electrically conductive electron suppressor electrode 358 at a first potential, a secondary electrode 356 at a second potential, and a suppressor electrode bias power supply 360. Please note that a conventional "ground" symbol has been employed in FIGS. 1, 2, 4 and 5, however those skilled in the art will understand that these symbols are not meant to imply connection to a particular electrical potential, rather they merely signify connection to a common electrical reference potential. Suppressor electrode bias power supply 360 provides a glitch suppression voltage $V_{GS}$ (preferably in the range from about 1 kV to about 5 kV) to negatively bias the electron suppressor electrode 358 with respect to secondary electrode 356 and the gas skimmer aperture 120, wherein the secondary electrode and skimmer are at approximately the same potential. Electron suppressor electrode 358 and secondary electrode 356 each have a coaxially-aligned aperture for transmission of the neutral supersonic gas-jet 118. The negatively biased electron suppressor provides an electric field in the region between the gas skimmer aperture 120 and the electron suppressor electrode 358 that causes any secondary electrons 362 ejected in the gas skimmer aperture region to follow trajectories 364 that return them toward the gas skimmer aperture 120 or electrically connected adjacent regions and prevents them from being accelerated and producing ionization in the supersonic gas-jet 118 in the region between gas skimmer aperture 120 and the ionizer 122. Both the extension tube 352 and electron suppressor apparatus 366 contribute to reduction of beam glitches due to discharges and arcing in the region between the gas skimmer aperture 120 and the ionizer 122. Used in combination as shown in FIG. 4, they are significantly more effective than the sum of their independent contributions. The combination reduces to a negligible level the skimmer-ionizer discharge as a source of beam glitching and has enabled production of stable GCIB beam currents on the order of 500 to 1000 microamperes with glitch rates from all causes on the order of one per hour. This is an improvement of from 10× to 100× over previously obtained results from conventional systems. While an electrostatic electron suppressor apparatus 366 has been shown, magnetic electron suppressors and other electron gates are expected to be effective as well.

Figure 5:
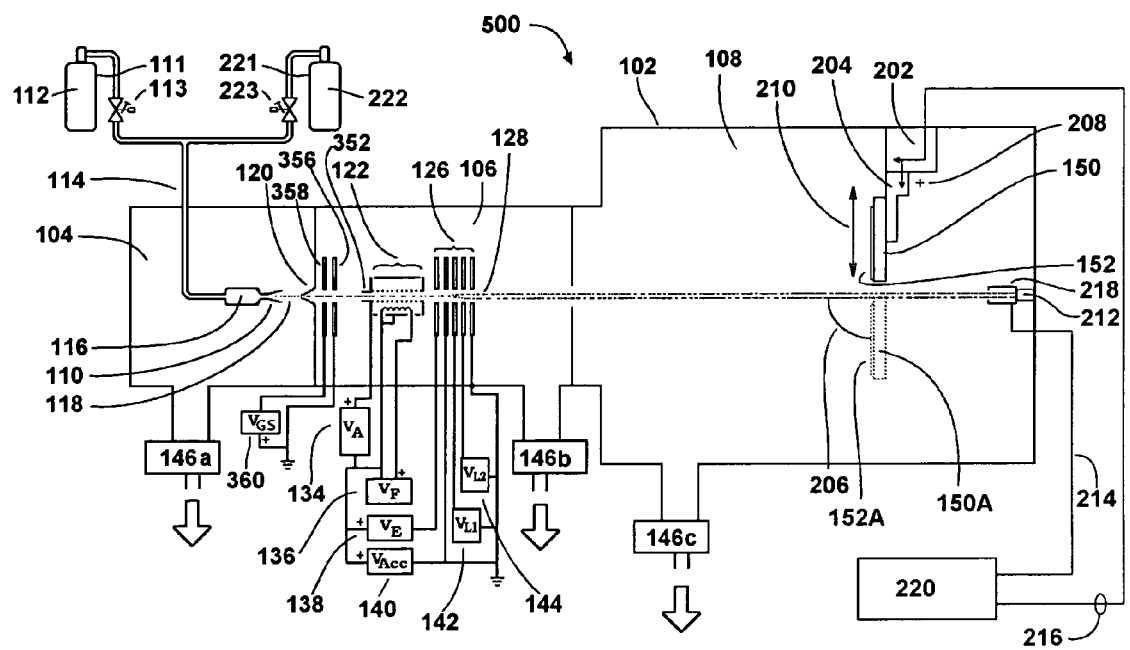
FIG. 5 is a schematic of the GCIB processing apparatus of the invention showing integration of the improvements into a complete GCIB processing apparatus for industrial processing of workpieces.

FIG. 5 is a schematic of a complete GCIB processing apparatus 500 for industrial workpiece processing including improvements in accordance with the present invention as shown in FIG. 4.

Although the invention has been described with respect to various embodiments, it should be realized this invention is also capable of a wide variety of further and other embodiments within the spirit of the invention.

It is claimed:

1. A high-current gas-cluster ion beam apparatus, comprising:
   a reduced-pressure chamber;
   a gas-jet generator within the reduced-pressure chamber, for generating a gas-jet comprising neutral gas-clusters;
   an ionizer for ionizing at least a fraction of the neutral gas-clusters in the gas-jet to form gas-cluster ions;
   an accelerator within the reduced-pressure chamber, for accelerating the gas-cluster ions to form an energetic gas-cluster ion beam; and
   an electron suppressor disposed between the gas-jet generator and the ionizer so as to substantially permit passage of the neutral gas-clusters to the ionizer, while substantially preventing passage of electrons between the gas-jet generator and the ionizer.

2. The apparatus of claim 1, wherein the gas-jet generator further comprises:
   a pressurized gas source;
   a nozzle for expanding pressurized gas from the pressurized gas source into the reduced-pressure chamber; and
   a skimmer aperture.

3. The apparatus of claim 1, wherein the ionizer has an entrance aperture for receiving the gas-jet.

4. The apparatus of claim 3, wherein:
   the gas-jet is substantially cylindrical and has an axis; and
   the ionizer geometry is substantially cylindrical and the entrance aperture is substantially circular with an approximate diameter, D.

5. The apparatus of claim 4, further comprising a tubular conductor disposed between the ionizer entrance aperture and the gas-jet generator and approximately coaxially aligned with the gas-jet axis.

6. The apparatus of claim 5, wherein:
   at least a portion of the gas-jet generator is electrically conductive and is electrically biased at a first electric potential;
   at least a portion of the ionizer is electrically conductive and is electrically biased at a distinct second electric potential; and
   the tubular conductor is biased at approximately the second electric potential so as to inhibit backward extraction of ions from the ionizer towards the gas-jet generator.

7. The apparatus of claim 6, wherein the second electric potential is from about 1 kV to about 60 kV positive with respect to the first electric potential.

8. The apparatus of claim 5, wherein the tubular conductor is substantially cylindrical and has a diameter, $D_1$ and a length L, L being greater than $D_1$.

9. The apparatus of claim 8, wherein $0.5D < D_1 < 1.5D$.

10. The apparatus of claim 1, wherein:
    at least a portion of the gas-jet generator is electrically conductive and is electrically biased at a first electric potential; and
    at least a portion of the ionizer is electrically conductive and is electrically biased at approximately a distinct second electric potential.

11. The apparatus of claim 10, wherein the electron suppressor further comprises:
    an electrically conductive electron suppressor electrode, electrically biased at a distinct third electric potential;

an electrically conductive electrode biased at approximately said first electric potential; and wherein the electrically conductive electron suppressor electrode and the electrically conductive electrode each have an aperture for transmission of the gas-jet.

12. The apparatus of claim 11, wherein:

the second electric potential is from about 1 kV to about 60 kV positive with respect to the first electric potential; and the third electric potential is from about 1 kV to about 5 kV negative with respect to the first electric potential.

13. The apparatus of claim 1, wherein the electron suppressor is a magnetic electron suppressor.

14. In a high-current gas-cluster ion beam system including within a reduced-pressure chamber a gas-jet generator for forming a gas-jet of neutral gas-clusters, an ionizer for ionizing at least a fraction of the neutral gas-clusters in the gas-jet to form gas-cluster ions, and an accelerator for accelerating the gas-cluster ions to form an energetic gas-cluster ion beam, an apparatus for improving beam stability and reducing transients in high current gas cluster ion beam generation, comprising:

an electron suppressor disposed between the gas-jet generator and said ionizer so as to substantially permit passage of the neutral gas-clusters to the ionizer, while substantially preventing passage of electrons between the gas-jet generator and the ionizer.

15. A high-current gas-cluster ion beam apparatus, comprising:

a reduced-pressure chamber;

a gas-jet generator within the reduced-pressure chamber, for generating a gas-jet comprising neutral gas-clusters, the gas-jet having an axis;

an ionizer for ionizing at least a fraction of the neutral gas-clusters in the gas-jet to form gas-cluster ions, the ionizer having an entrance aperture for receiving the gas-jet;

a tubular conductor disposed between the ionizer entrance aperture and the gas-jet generator and approximately coaxially aligned with the gas-jet axis; and an accelerator within the reduced-pressure chamber, for accelerating the gas-cluster ions to form an energetic gas-cluster ion beam;

wherein the apparatus is constructed and arranged so as to inhibit backward extraction of ions from the ionizer towards the gas-jet generator.

16. The apparatus of claim 15, wherein the gas-jet generator further comprises:

a pressurized gas source;

a nozzle for expanding pressurized gas from said pressurized gas source into said reduced-pressure chamber; and a skimmer aperture.

17. The apparatus of claim 15, wherein:

the gas-jet is substantially cylindrical; and the ionizer geometry is substantially cylindrical and the entrance aperture is substantially circular with an approximate diameter, D.

18. The apparatus of claim 15, wherein:

at least a portion of the gas-jet generator is electrically conductive and is electrically biased at a first electric potential;

at least a portion of the ionizer is electrically conductive and is electrically biased at a distinct second electric potential; and the tubular conductor is biased at approximately the second electric potential so as to inhibit backward extraction of ions from the ionizer towards the gas-jet generator.

19. The apparatus of claim 18, wherein the tubular conductor is substantially cylindrical and has a diameter $D_1$ and a length L, L being greater than $D_1$.

20. The apparatus of claim 19, wherein $0.5D<D_1<1.5D$.

21. In a high-current gas-cluster ion beam system including within a reduced-pressure chamber a gas-jet generator for forming a gas-jet of neutral gas-clusters, an ionizer having an entrance aperture for ionizing at least a fraction of the neutral gas-clusters in the gas-jet to form gas-cluster ions, and an accelerator for accelerating the gas-cluster ions to form an energetic gas-cluster ion beam, an apparatus for improving beam stability and reducing transients in high current gas cluster ion beam processing, comprising:

a tubular conductor disposed between the ionizer entrance aperture and the gas-jet generator and approximately coaxially aligned with the gas-jet axis.

22. A method of improving the stability of a gas-cluster ion beam having a beam current on the order of 500 to 1000 microamperes, comprising the steps performed in a reduced-pressure chamber of:

generating with a gas-jet generator a gas-jet of neutral gas-clusters;

permitting passage of the neutral gas-clusters to an ionizer, while substantially preventing passage of electrons between the gas-jet generator and the ionizer, so as to reduce the incidence of electrical discharge in the gas-jet;

ionizing at least a fraction of the neutral gas-clusters in the gas-jet to form gas-cluster ions; and accelerating the gas-cluster ions to form an energetic gas-cluster ion beam.

23. A method of improving the stability of a gas-cluster ion beam having a beam current on the order of 500 to 1000 microamperes, comprising the steps performed in a reduced-pressure chamber of:

generating with a gas-jet generator a substantially cylindrical gas-jet of neutral gas-clusters, the gas-jet having a gas-jet axis;

providing an ionizer having an entrance aperture for receiving the gas-jet, the ionizer including a tubular conductor disposed between the ionizer entrance aperture and the gas-jet generator and approximately coaxially aligned with the gas-jet axis;

electrically biasing the tubular conductor and at least a portion of the ionizer at an electrical potential distinct from the gas-jet generator, so as to reduce the incidence of electrical discharge in the gas-jet;

ionizing at least a fraction of the neutral gas-clusters in the gas-jet to form gas-cluster ions; and accelerating the gas-cluster ions to form an energetic gas-cluster ion beam.

* * * * *